United States Patent
Roeckelein et al.

(10) Patent No.: US 6,653,835 B2
(45) Date of Patent: Nov. 25, 2003

(54) MAGNETIC RESONANCE TOMOGRAPH WITH A TEMPERATURE CONTROLLER FOR THERMALLY HIGHLY SENSITIVE COMPONENTS

(75) Inventors: Rudolf Roeckelein, Erlangen (DE); Klaus Schleicher, Nuremberg (DE)

(73) Assignee: Siemens Aktiengesellschaft, München (DE)

( * ) Notice: Subject to any disclaimer, the term of this patent is extended or adjusted under 35 U.S.C. 154(b) by 3 days.

(21) Appl. No.: 09/962,736

(22) Filed: Sep. 25, 2001

(65) Prior Publication Data

US 2002/0079893 A1 Jun. 27, 2002

(51) Int. Cl.⁷ .................................................. G01V 3/00
(52) U.S. Cl. .................... 324/315; 324/318; 324/319
(58) Field of Search ................................ 324/315, 318, 324/319, 320, 3; 335/300, 316

(56) References Cited

U.S. PATENT DOCUMENTS

| | | | |
|---|---|---|---|
| 5,652,517 A | 7/1997 | Maki et al. | 324/315 |
| 6,297,634 B1 * | 10/2001 | aoki | 324/315 |
| 6,313,634 B1 * | 11/2001 | Kasten | 324/320 |
| 6,437,672 B1 * | 8/2002 | Takeshima et al. | 335/216 |
| 6,489,873 B1 * | 12/2002 | Kruip et al. | 335/300 |

FOREIGN PATENT DOCUMENTS

WO  WO 00/16116  3/2000

* cited by examiner

Primary Examiner—Diego Gutierrez
Assistant Examiner—Brij B. Shrivastav
(74) Attorney, Agent, or Firm—Schiff Hardin & Waite

(57) ABSTRACT

A magnetic resonance tomography apparatus, in particular an iron-guided or permanently magnetic, short or open magnetic resonance tomography apparatus, has thermally highly sensitive components and a temperature controller, formed by a foil heater which is provided with a control device and can be controlled in opposition to the internal dynamic heat sources.

17 Claims, 1 Drawing Sheet

MAGNETIC RESONANCE TOMOGRAPH WITH A TEMPERATURE CONTROLLER FOR THERMALLY HIGHLY SENSITIVE COMPONENTS

BACKGROUND OF THE INVENTION

1. Field of the Invention

The present invention relates to a magnetic resonance tomography apparatus, in particular an iron-guided or permanently magnetic, short or open magnetic resonance (MR) tomography system, with thermally highly sensitive components and a temperature controller.

2. Description of the Prior Art

In iron-guided or permanent magnet magnetic resonance tomography systems, there are thermally highly sensitive components which strongly influence the homogeneity of the background field. Permanent magnets, shim plates or the like are examples of this. The temperature of these components must therefore be kept stable, since compensating the influence of these usually large-area components by means of software is possible only under certain conditions.

For example, a dynamic heat input arises due to fluctuations in room temperate or cooling water temperature, due to the time-dependent ohmic losses in the gradient coils, or due to eddy current losses in the components themselves. In the case of applications presently planned in an open MR system, the component temperature is permitted to fluctuate only by less than 0.5 K/10 min, it being necessary in this case to take account of the fact that power inputs in the range of 200–300 W/m$^2$ are already a reality. Substantially more stringent requirements are expected in the future.

The problem of temperature-dependent inhomogeneity arises, firstly, when iron is used for field guidance, i.e., in the case of short or open MR systems, and secondly in the case of systems where permanent magnets are used for field generation. Moreover, some applications require extremely high field homogeneities such as, for example, in the case of spectroscopy. Equipment exhibiting these specifications is barely known at the moment, since the conventional stabilization of the temperature by water cooling or by means of heating cartridges does not permit the required sensitive correction, specifically in the case of permanent magnet systems.

SUMMARY OF THE INVENTION

It is an object of the present invention to configure a magnetic resonance tomography apparatus of the type initially described so as to ensure that the temperature can be kept constant in a fashion that can be sensitively controlled and stabilized with particular accuracy, thereby to ensure a particularly high level of homogeneity of the basic field.

This object is inventively achieved in a magnetic resonance tomography apparatus a foil heater which is provided with a control device and can be controlled in opposition to the internal dynamic heat sources.

According to the invention, the temperature is kept stable not by cooling mechanisms, but by an active auxiliary heater. The heater is switched on in the initial state, i.e., when no dynamic heat sources are present. During operation under load, that is to say when dynamic heat sources tend to influence the corresponding component temperatures, the corresponding heat input is compensated by decreasing to output of the active heater. The heater must react very quickly in order to ensure the effectiveness of this compensation, i.e., the heater must be situated close to the component and exhibit a spatial distribution corresponding to the discrepancies to be expected. All this is accomplished by the foil heater provided according to the invention which, in addition, does not unnecessarily enlarge the installation space, as is the case with a water cooler or in the use of heating cartridges.

In an embodiment the foil heater can be of bifilar design, and therefore no disturbance fields can be caused by the temperature compensation heater.

In order to be able to react particularly quickly to possible disturbing heat sources, and to compensate these by counteracting control, in a further embodiment of the invention the foil heater is arranged directly in the region of the heat sources formed by permanent magnets, shim plates or the like, for example between the shim plates and the neighboring gradient coils.

In order to be able to keep the control device as simple as possible, in another embodiment the invention the control device exhibits preliminary compensation on the basis of calculated and/or predetermined heat sources, so that the temporal and spatial characteristics of the heat sources, and thus the current characteristic required for the compensation, are determined for the foil heater in the control device by appropriate algorithms from the previously known current sequences of the gradient coils. Only a few feedback sensors are then still required, and the corrections caused by them are likewise only very slight.

In addition to the advantage of a quick thermal response to such a foil heater, and a good control response, the temperature controller according to the invention, by means of an active foil heater, has the advantages that there is a need for only a small amount of space, that no disturbance fields occur due to the bifilar arrangement, and that there is a good possibility of being able to adapt the local heat output in conjunction with a low price for the arrangement. It is particularly advantageous in this case to be able to adapt the local heat output to the monetary disturbing sources, and this—apart from the very much larger spatial requirement—is not the case with a water cooler or with counteracting control by heating cartridges.

DESCRIPTION OF THE PREFERRED EMBODIMENTS

Figure 1:
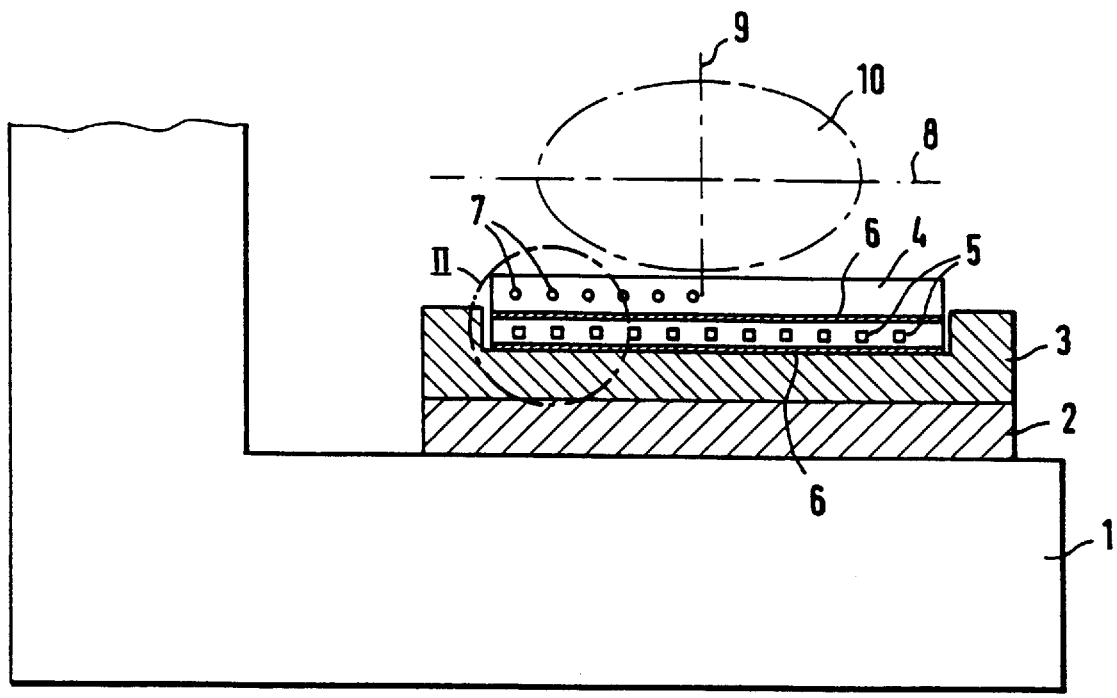
FIG. 1 shows a partial section through an open magnetic resonance tomography apparatus according to the invention.
Figure 2:
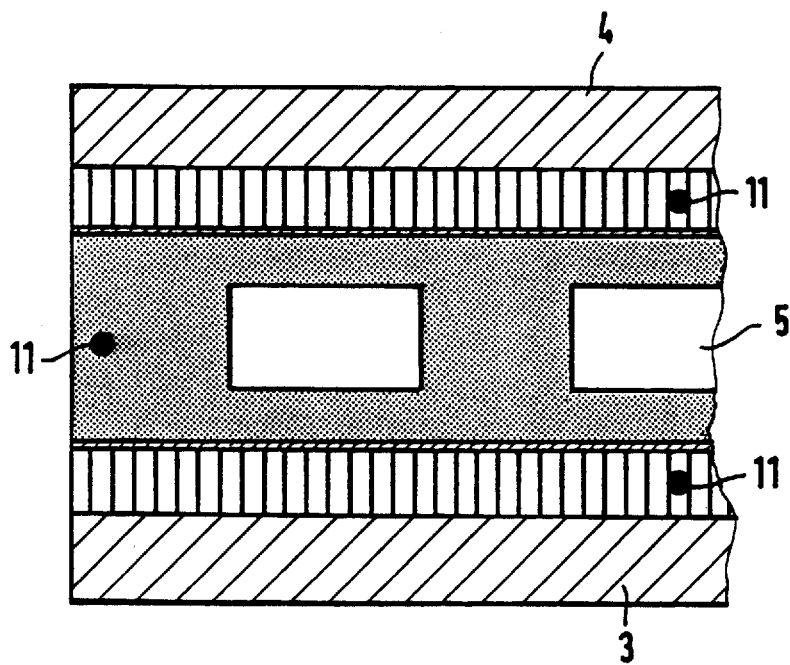
FIG. 2 shows an enlarged detail of the region 11 in FIG. 1.

Provided on the open C-arm 1 of the magnetic resonance tomography apparatus partially illustrated in FIG. 1, for the purpose of generating the basic field, is a permanent magnet 2 on which the gradient coils are constructed, specifically a gradient coils constructed in a secondary fashion, and a gradient coil 4 constructed in a primary fashion. Located between these are the shim plates 5 which, in addition to other thermally highly sensitive components, can exert a particularly strong influence on the homogeneity of the basic field of the system. In order to be able to achieve the requisite constancy of temperature, heating foils 6 are respectively provided, preferably in a bifilar winding, between the shim plates 5 and the gradient coils 3 and 4, in order to be able to compensate the disturbing heat sources during operation under load by decreasing the output of the heating of these heating foils. A conventional water cooler 7 is also provided in the gradient coils, but which is not sufficient for keeping the temperature exactly constant, particularly of the thermally highly sensitive components such as the shim irons. The patient space 10 has a symmetry plane, and a symmetry axis 9. Sensors 11 serve the purpose of exactly controlling the heating current of the foil heater formed by the foils 6, which is already subjected to far-reaching preliminary control via appropriate algorithms. Owing to the preliminary control, the feedback component need not be of complicated configuration in the controller.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance tomography apparatus comprising:
   a magnet-containing scanner for obtaining magnetic resonance data, said scanner including heat-sensitive components which are thermally highly sensitive to internal dynamic heat sources; and
   a temperature controller comprising a foil heater in thermal communication with said heat sensitive components, and a control device connected to said foil heater for controlling said foil heater to oppose heat generated by said internal dynamic heat sources, said control device controlling said foil heater to compensate in advance for said heat produced by said internal dynamic heat sources using predetermined stored data representing said internal dynamic heat sources.

2. A magnetic resonance tomography apparatus as claimed in claim 1 wherein said foil heater is a bifilar foil heater.

3. A magnetic resonance tomography apparatus as claimed in claim 1 wherein said internal dynamic heat sources are heat sources selected from the group consisting of permanent magnets and shim plates, and wherein said foil heater is disposed directly in contact with said heat sources.

4. A magnetic resonance tomography apparatus as claimed in claim 1 wherein said scanner comprises gradient coils and shim plates, and wherein said foil heater is disposed between said gradient coils and said shim plates.

5. A magnetic resonance tomography apparatus as claimed in claim 1 wherein said control device controls said foil heater to compensate in advance for heat produced by said internal dynamic heat sources by calculating said heat produced by said internal dynamic heat sources.

6. A magnetic resonance tomography apparatus as claimed in claim 1 further comprising feedback sensors thermally coupled to said foil heater and electrically connected to said control device, for supplying feedback signals to said control device for use by said control device for controlling said foil heater.

7. A magnetic resonance tomography apparatus comprising:
   a magnet-containing scanner for obtaining magnetic resonance data, said scanner including heat-sensitive components which are thermally highly sensitive to internal dynamic heat sources; and
   a temperature controller comprising a foil heater in thermal communication with said heat sensitive components, and a control device connected to said foil heater for controlling said foil heater to oppose heat generated by said internal dynamic heat sources, said control device controlling said foil heater to compensate in advance for said heat generated by said internal dynamic heat sources by calculating said heat produced by said internal dynamic heat sources and using stored predetermined data representing said internal dynamic heat sources.

8. A magnetic resonance tomography apparatus as claimed in claim 7 wherein said foil heater is a bifilar foil heater.

9. A magnetic resonance tomography apparatus as claimed in claim 7 wherein said internal dynamic heat sources are heat sources selected from the group consisting of permanent magnets and shim plates, and wherein said foil heater is disposed directly in contact with said heat sources.

10. A magnetic resonance tomography apparatus as claimed in claim 7 wherein said scanner comprises gradient coils and shim plates, and wherein said foil heater is disposed between said gradient coils and said shim plates.

11. A magnetic resonance tomography apparatus as claimed in claim 7 wherein said control device controls said foil heater to compensate in advance for heat produced by said internal dynamic heat sources by calculating said heat produced by said internal dynamic heat sources.

12. A magnetic resonance tomography apparatus as claimed in claim 7 further comprising feedback sensors thermally coupled to said foil heater and electrically connected to said control device, for supplying feedback signals to said control device for use by said control device for controlling said foil heater.

13. A magnetic resonance tomography apparatus comprising:
   a magnet-containing scanner for obtaining magnetic resonance data, said scanner including heat-sensitive components which are thermally highly sensitive to internal dynamic heat sources; and
   a temperature controller comprising a foil heater in thermal communication with said heat sensitive components, and a control device connected to said foil heater for controlling said foil heater to oppose heat generated by said internal dynamic heat sources, said scanner including gradient coils operated according to at least one pulse sequence for obtaining said magnetic resonance data, said control device supplying a current, having a current characteristic associated therewith, to said foil heater for compensating for said heat produced by said internal dynamic heat sources, and said control device setting said current characteristic dependent on temporal and spatial characteristics of said heat sources and employing algorithms dependent on said pulse sequences for operating said gradient coils.

14. A magnetic resonance tomography apparatus as claimed in claim 13 wherein said foil heater is a bifilar foil heater.

15. A magnetic resonance tomography apparatus as claimed in claim 13 wherein said internal dynamic heat sources are heat sources selected from the group consisting of permanent magnets and shim plates, and wherein said foil heater is disposed directly in contact with said heat sources.

16. A magnetic resonance tomography apparatus as claimed in claim 13 wherein said scanner comprises gradient coils and shim plates, and wherein said foil heater is disposed between said gradient coils and said shim plates.

17. A magnetic resonance tomography apparatus as claimed in claim 13 wherein said control device controls said foil heater to compensate in advance for heat produced by said internal dynamic heat sources by calculating said heat produced by said internal dynamic heat sources.

* * * * *